United States Patent [19]

Swapp

[11] Patent Number: 5,172,050
[45] Date of Patent: Dec. 15, 1992

[54] MICROMACHINED SEMICONDUCTOR PROBE CARD

[75] Inventor: Mavin Swapp, Mesa, Ariz.

[73] Assignee: Motorola, Inc., Schaumburg, Ill.

[21] Appl. No.: 655,705

[22] Filed: Feb. 15, 1991

[51] Int. Cl.⁵ .......................... G01R 1/02; B44C 1/22
[52] U.S. Cl. ................................ 324/158 P; 324/72.5; 439/482; 156/653
[58] Field of Search ............ 324/158 P, 158 F, 158 R, 324/72.5; 439/482; 437/8; 29/852, 825, 846, 842, 843, 827; 156/644, 651, 652, 653, 654, 655

[56] References Cited

U.S. PATENT DOCUMENTS

| | | | |
|---|---|---|---|
| 4,038,599 | 7/1977 | Bove et al. | 324/158 F |
| 4,520,314 | 5/1985 | Asch et al. | 324/158 P |
| 4,563,640 | 1/1986 | Hasegawa | 324/158 P |
| 4,757,255 | 7/1988 | Margozzi | 324/158 F |
| 4,787,752 | 11/1988 | Fraser et al. | 324/158 F |
| 4,799,009 | 1/1989 | Tada et al. | 324/158 F |
| 4,961,052 | 10/1990 | Tada et al. | 324/158 F |
| 4,983,907 | 1/1991 | Crowley | 324/158 P |
| 5,012,187 | 4/1991 | Littlebury | 324/72.5 |

OTHER PUBLICATIONS

Leslie et al; "Membrane Probe Technology"; 1988 International Test Conference; pp. 601-607; 1988 IEEE.

*Primary Examiner*—Vinh Nguyen
*Attorney, Agent, or Firm*—Stuart T. Langley

[57] ABSTRACT

A semiconductor probe card having a plurality of micromachined probes tips for contacting an array of electrode pads formed on a semiconductor integrated circuit is provided. The plurality of probe tips are formed on the top surface of the substrate wherein the probe tips are arranged in an array matching of electrode pads on the integrated circuit to be tested. A portion of the semiconductor substrate underneath the probe tips is thin, so that the probe tips rests on a flexible diaphragm or beam.

14 Claims, 2 Drawing Sheets

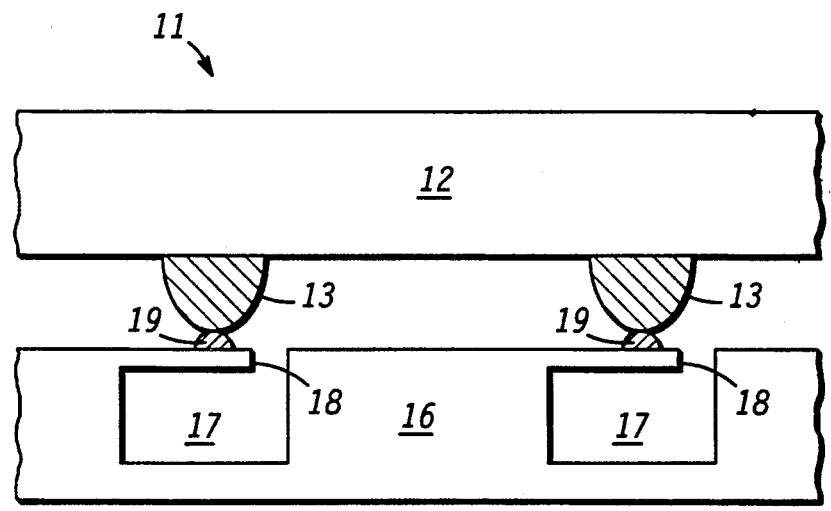
FIG. 1
FIG. 2
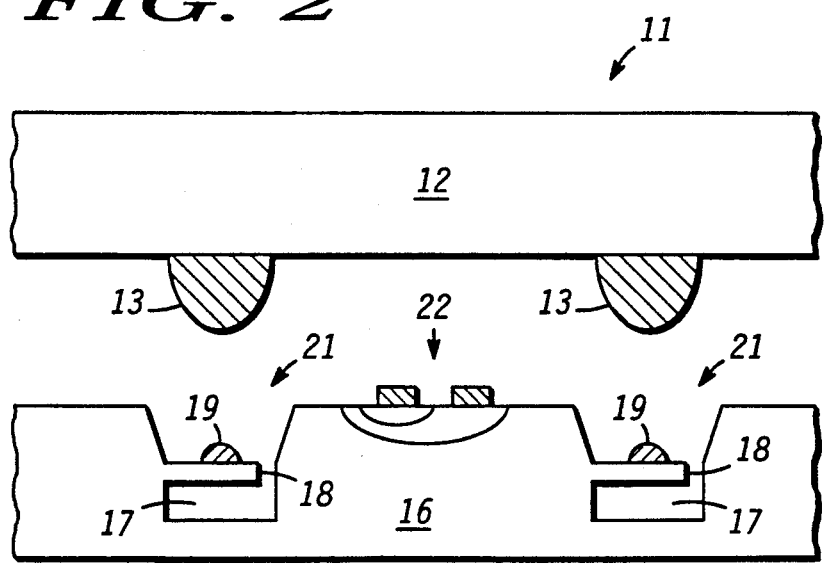

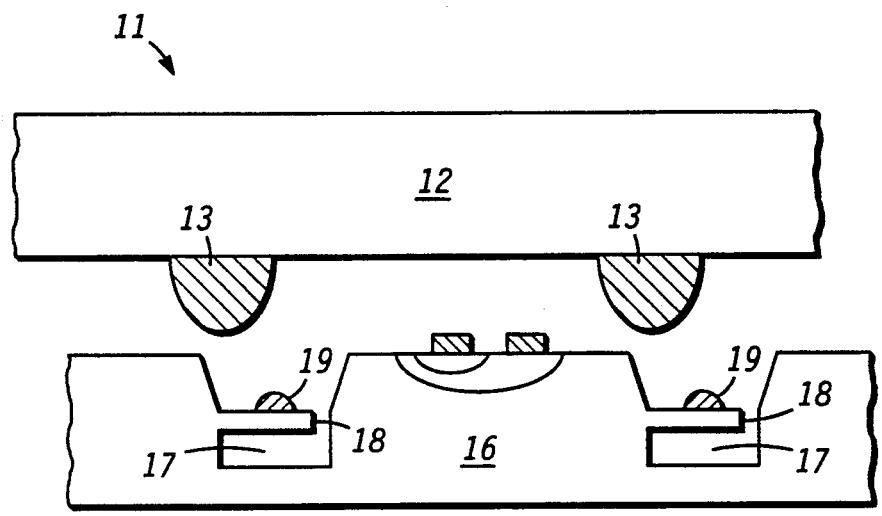
FIG. 3
FIG. 4
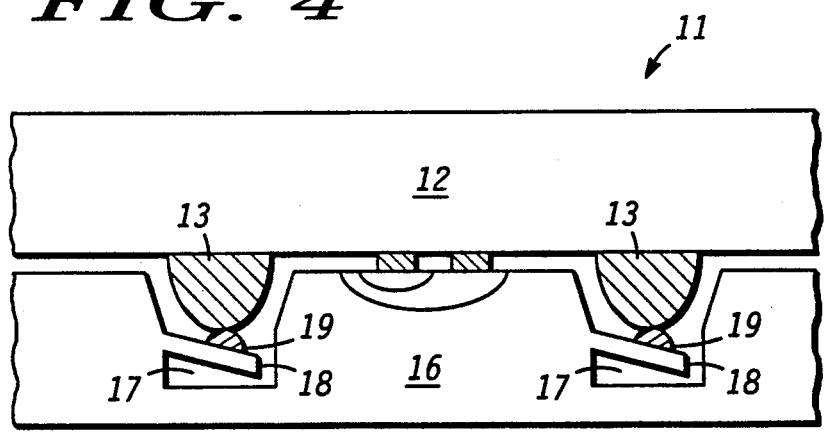

MICROMACHINED SEMICONDUCTOR PROBE CARD

BACKGROUND OF THE INVENTION

This invention relates, in general, to probe cards for testing unencapsulated integrated circuits (ICs) and, more specifically, to a probe card manufactured from semiconductor materials.

Electrical probing or testing is an important step in the production of semiconductor devices such as monolithic ICs. The probing step constitutes a final inspection step in the production of a wafer before assembling the IC and thus plays an extremely important role in the sense that it gives great influence over the labor saving and work efficiency in subsequent assembly steps. The accuracy or precision of the inspection in the probing step has become a decisive factor for the yield of final products.

A fixed probe board, or probe card, is ordinarily used in the probing step. A typical fixed probe board is disclosed in U.S. Pat. No. 4,563,640 issued to Hasegawa. A fixed probe board comprises a multiplicity of probe needles fixed by a support base and an adhesive layer in an array which matches an array of electrode pads on an integrated circuit to be tested.

A large portion of the cost of manufacturing an integrated circuit is incurred in packaging the integrated circuit. It is desirable to package only functional integrated circuits so that packaging cost is not incurred on devices which will be thrown away. Due to close spacing of electrode pads which are formed on the semiconductor integrated circuits, however, it has been difficult to make contact to enough integrated circuits to make parallel testing practical. The probe needles must be aligned to the pattern of the electrode pads on the integrated circuit and must remain aligned through many test cycles. This alignment problem becomes more difficult as more probe needles are added to the probe card. This problem has made it virtually impossible to test more than four integrated circuits in parallel in chip or wafer form.

In addition to the alignment problem with probe needles, non-planarity in semiconductor wafers created difficult in contacting all of the contact pads. As attempts were made to place more needles in contact with the wafer, this co-planarity problem becomes more acute. Although probe cards have been made with probe needles which can test up to four semiconductor memories in parallel, due to the difficulty set out above operating speed is low, maintenance cost is high and reliability is compromised.

Access time is a figure of merit for semiconductor memories and other high speed devices. Memories must be tested with high speed and sorted into groups having similar access times. Conventional probe needle testing does not allow this high speed testing, and so the sorting operation could only be done after the devices were encapsulated in plastic. This made it difficult to predict availability of memory of a particular access time group until the very end of the assembly process. It is advantageous to know the access time of a memory as early as possible, preferably when the memories are still in wafer form.

Recently, membrane probe card technology has been used to probe integrated circuit chips with closely spaced contact pads. This technology was described by B. Leslie and F. Matta in "Membrane Probe Card Technology (The Future for High Performance Wafer Test)," presented at the 1988 IEEE International Test Conference. This technology has been used to replace probe needles with probe bumps which are formed on a flexible membrane. However, since chips were still tested individually, little improvement was realized in process cycle time.

It has long been known that most integrated circuits are subject to a certain infant mortality level caused by latent defects in the devices. In particular, semiconductor memories which have a relatively large die size and use particularly thin gate oxides, are susceptible to infant mortality problems. The bulk of these early failures can be gleaned out by extensively exercising the circuits at high temperature. Exercising the circuit means to apply power to the circuit, and to send data signals to the circuit which activate various portions of the circuit. A memory circuit which comprises thousands or millions of memory cells, for example, is exercised by addressing each memory cell and storing and retrieving data from that cell. When this process is performed at high temperature, it is called burn-in.

Typically, memory circuits are burned-in for 72 or more hours at temperatures exceeding 100° C. In the past, this process has been performed after the circuits have been assembled and tested. The burn-in process requires that the semiconductor packages be loaded into board of 50 or more units so that they can be exercised in parallel. The boards are then loaded into ovens which control the ambient temperature during burn-in.

Increasingly stringent reliability requirements for semiconductor memories have led many manufacturers to burn-in 100% of their product before shipment. The physical space required to house burn-in ovens for a single manufacturer is enormous. The burn-in of memory circuits along for a single manufacturer may occupy several city blocks of multi-story buildings. Not only physical space is lost: the power required to heat the burn-in ovens and power the exercising circuits is considerable. This is because integrated circuits from a single wafer once encapsulated, loaded into boards, and loaded into an oven, will take up several cubic feet of space which must then be heated and cooled to perform the burn-in.

Not only is physical cost high, but labor cost is high also. Loading packaged integrated circuits into boards and removing them from boards is a labor intensive and is usually a manual operation. Additionally, after burn-in, integrated circuits must be repackaged in shipping tubes or boxes so they can be further processed or sold. These labor intensive operations can add days to the cycle time of a burn-in operation. Attempts to automate board loading and packaging processes have been met with little success, due to the delicate nature of the process.

Although the burn-in operation is designed to improve the reliability of the integrated circuits, oftentimes it compromises the quality of packaged devices. Manual loading and unloading of integrated circuits often damages leads which extend outside the integrated circuit package. This damage is usually not repairable and results in completely functional devices being rejected for physical quality problems. In addition to lead damage, package damage can occur. Also, handling of packaged integrated circuits increases the chances of damage to the circuits themselves by electrostatic discharge. Although burn-in is necessary to provide the desired reliability, the above mentioned quality limitations have long been a costly problem for circuit manufacturers.

One apparatus for burning-in integrated circuits in wafer form is disclosed in U.S. Pat. No. 4,968,931 entitled "Means and Method for Burning-In Integrated Circuit Wafers" and assigned to the assignee of the present invention. This method uses membrane probe card technology described hereinbefore to contact a plurality of integrated circuits in parallel. One difficulty with this method is that due to differential coefficients and thermal expansion between the integrated circuit wafer and the membrane probe card, the probe card had to be designed for operation at a specific temperature and could only be aligned to and contact the integrated circuit wafer once that temperature was reached. This required a relatively elaborate and difficult alignment process, particularly when a large number of integrated circuits having a large number of electrode pads were used.

Conventionally, integrated circuits were formed having an array of electrode pads around the periphery of the IC chip. Recently, however, manufacturers are designing ICs having an array of electrode pads spread across the surface area of the IC chip. For large numbers of electrode pads, conventional probe card technology can not be used to test ICs with such an electrode array. Some manufacturers have resorted to flip chip bonding the integrated circuit onto a test circuit board, testing the ICs, then removing the integrated circuits and repairing the damaged bonds. This relatively expensive process results in significant amounts of damage to the integrated circuits. It would be advantageous to have a probe card technology which could couple to integrated circuits having electrode pads in any configuration quickly, reliably, and without damage to the integrated circuits.

SUMMARY OF THE INVENTION

The objects and advantages of the present invention are achieved by a semiconductor probe card having a plurality of micromachined probes for contacting an array of electrode pads formed on a semiconductor integrated circuit. In a method for manufacturing a probe head in accordance with the present invention, a semiconductor substrate is provided which is similar in composition and crystal orientation to the integrated circuit to be tested. The plurality of probe tips are formed on the top surface of the substrate wherein the probe tips are arranged in an array matching of electrode pads on the integrated circuit to be tested. A portion of the semiconductor substrate underneath the probe tips is thin, so that the probe tips rests on a flexible diaphragm or beam.

In another embodiment in accordance with the present invention, each semiconductor probe further comprises a well having sloped sides formed over and surrounding the probe tips wherein the well is sized to receive an electrode of the integrated circuit to be tested. The well serves to self align the integrated circuit to the probe tips.

In a method of using the semiconductor probe card of the present invention, an integrated circuit is placed on the semiconductor probe card so that the electrode pads are in rough alignment with the spring mounted probes. The semiconductor probe card is vibrated to fine align the array of electrode pads with the array of probes, thereby contacting the array of electrode pads with the array of probes. The integrated circuit and semiconductor probe card are pressed together deforming some of the spring mounted probes to compensate for dimensional variations in electrode pads, integrated circuit, and semiconductor probe card. Once contact is made, the integrated circuit is electrically tested.

BRIEF DESCRIPTION OF THE DRAWINGS

FIG. 1 - FIG. 4 illustrate highly simplified cross-sectional views of a semiconductor probe card in accordance with the present invention.

DETAILED DESCRIPTION OF THE DRAWINGS

FIG. 1 illustrates a cross-sectional view of a simple embodiment of a semiconductor probe card in accordance with the present invention. Integrated circuit to be tested 11 comprises substrate 12 and electrode pads 13. Electrode pads may be distributed across the surface of substrate 12 or aligned around the periphery of integrated circuit 11. Integrated circuit 11 may be a part of a semiconductor wafer or separated from the semiconductor wafer. Electrode pads 13 are illustrated as solder bumps commonly used in flip chip bonding. It should be understood that conventional electrode pads, which are much smaller, can also be used in accordance with the present invention.

Semiconductor probe card 16 comprises a semiconductor material which is preferably of the same type and orientation as that of substrate 12. Cavities 17 are etched into a top surface of semiconductor probe card 16 in order to thin a portion 18. Thinned portion 18 is illustrated as a cantilever beam although diaphragms or other beam structures may be used. Thinned portion 18 may be of the same substrate as probe card 16 or may be an overlying layer of a material such as polycrystalline silicon. Micro-machining techniques are known for forming thinned portion 18 of either single crystal silicon, polysilicon, or other materials.

Probe tip 19 is formed on top of thinned portion 18. Probe tip 19 preferably comprises a noble metal alloy as is conventionally used in probe needles. The noble metal alloy insures longer life and because it oxidizes less than many metals, providing better contact to electrodes 13. Conductive interconnects 23 are formed on the surface of semiconductor probe card 16 to couple probe tips 19 to external test circuitry (not shown).

The simple embodiment shown in FIG. 1 is adequate for many probing needs, particularly large geometry integrated circuits and discrete devices. Although contact can be made over a large surface area, such as an entire wafer, alignment of intricate patterns of electrode pads 13 to probe tips 19 is difficult. Another embodiment shown in FIG. 2 provides a solution to this problem. In the cross-section shown in FIG. 2, integrated circuit 11 is the same as that shown in FIG. 1. Elements of FIG. 2 designated with the same number as elements in FIG. 1 are similar in structure and function to those elements shown in FIG. 1. A major difference between the embodiment shown in FIG. 1 and that shown in FIG. 2 is the addition of etched wells 21 over thinned portions 18 and probe tips 19. Preferably, well 21 has sloped sidewalls and is sized to receive one electrode pad 13.

Another feature shown in FIG. 2 is the addition of electronic devices 22 formed on the surface of semiconductor probe card 16. Because semiconductor probe card 16 is formed of a semiconductor material, a large variety of devices 22, both active and passive, can be formed on the surface of semiconductor probe card 16. Electronic devices 22 allow the integration of some test circuitry directly onto the surface of semiconductor probe card 16. Such integration can greatly simplify pin electronics required for testing complex integrated circuits. For example, electronic devices 22 can be configured to detect signals from the integrated circuit under test and, using circuits known in the testing art, to limit power to an integrated circuit under test if the detected signal indicates the integrated circuit has become nonfunctional during testing. Electronic devices 22 are interconnected with probe tips 19 and an external tester (not shown) in order to aid testing of integrated circuit 11. It should be understood that integration of electronic devices can also be done in the embodiment shown in FIG. 1.

FIG. 3 illustrates a first step in contacting semiconductor probe card 16 to integrated circuit 11. Integrated circuit 11 is placed in rough alignment with probe card 16 by aligning electrode pads 13 to etched wells 21. This rough alignment can be done by robots or human operators. It is not important at this stage that every electrode pad 13 be in contact with probe tips 19.

Semiconductor probe card 16 and/or integrated circuit 12 are vibrated causing electrode pads 13 to fall into wells 21. This self aligning feature offers tremendous advantage in testing large numbers of integrated circuits, large sized integrated circuits, or integrated circuits with a large number of electrode pads 13.

As shown in FIG. 4, once rough alignment is complete, integrated circuit 11 and semiconductor probe card 16 are pressed together. Due to variations in size of electrode pads 13, planarity of integrated circuit 12 and semiconductor probe card 16, each electrode pad 13 will extend a different amount into wells 21. As integrated circuit 11 is pressed against probe card 16, thinned portions 18 will deflect compensating for these dimensional variations. Once semiconductor probe card 16 and integrated circuit 11 are pressed firmly together all electrode pads 13 will be forced in contact with probe tips 19. Because thinned portions 18 compensate for dimensional variations, exceptional contact can be made between probe tips 19 and electrode pads 13 over a large surface area.

Because semiconductor probe card 16 is formed of the same material and crystal orientation as integrated circuit substrate 12, thermal expansion properties of semiconductor probe card 16 will be matched exactly with that of substrate 12. This feature is vital when testing integrated circuits at varying temperatures. Because semiconductor probe card 16 will expand and contract at the same rate as integrated circuit 11, firm contact can be made at room temperature and both integrated circuit 11 and probe card 16 raised to burn-in temperatures. In this manner a large number of integrated circuits can be coupled in parallel, heated, and burned-in while still unencapsulated. In fact, it is possible to burn-in an entire integrated circuit wafer before separating integrated circuits from the wafer. Once testing or burn-in is complete, integrated circuit 11 is removed with electrode pads 13 substantially undamaged and ready for further packaging. Probe card 16 can be reused immediately.

By now it should be appreciated that a semiconductor probe card is provided wherein the probe card is particularly useful in making contact to a large number of electrode pads on an integrated circuit. The semiconductor probe card offers unlimited arrangement for probe tips, and so can accommodate a wide variety of circuit layouts. Because the probe card is formed on a semiconductor substrate, test electronics can be integrated onto the semiconductor probe card itself, greatly improving performance and functionality of a test apparatus. Also, because thermal expansion of the probe card will match that of the integrated circuit under test, the probe card of the present invention is very useful in testing unencapsulated integrated circuits at high and low temperatures.

I claim:

1. A method of manufacturing a probe head for semiconductor integrated circuit (IC) test equipment wherein the probe head contacts an array of electrode pads formed on a semiconductor IC to transmit an electric signal to external test circuitry, the method comprising the steps of: providing a semiconductor substrate; forming a plurality of probe tips on a top surface of the substrate, wherein the probe tips are arranged in an array matching that of the electrode pads; forming a conductive interconnect on the semiconductor substrate for coupling each of the probe tips to external test circuitry; and thinning a portion of the semiconductor substrate surrounding each probe tip so that the thinned portion becomes flexible.

2. The method of claim 1 wherein the thinning step further comprises the steps of: etching a cavity in the semiconductor substrate; and forming a cantilever beam extending over the cavity, wherein the cantilever beam is the thinned portion which becomes flexible.

3. The method of claim 1 further comprising the steps of fabricating semiconductor devices on the semiconductor substrate, wherein the semiconductor devices are coupled to the probe tips and the external test circuitry by the conductive interconnect.

4. A method of manufacturing a probe head for semiconductor integrated circuit (IC) test equipment wherein the probe head contacts an array of electrode pads formed on a semiconductor IC to transmit an electric signal to external test circuitry, the method comprising the steps of: providing a semiconductor substrate; forming a plurality of probe tips on a top surface of the substrate, wherein the probe tips are arranged in an array matching that of the electrode pads; forming a conductive interconnect on the semiconductor substrate for coupling each of the probe tips to external test circuitry; thinning a portion of the semiconductor substrate surrounding each probe tip so that the thinned portion becomes flexible; and forming a well over each probe tip, wherein the well has sloped sidewalls and the probe tip is recessed within the well.

5. A method of testing an unencapsulated integrated circuit comprising the steps of: providing an integrated circuit having an array of electrode pads for communicating with a tester; forming an self-aligning semiconductor probe card having an array of spring mounted probes, wherein the array of probes corresponds to the array of electrode pads; placing the integrated circuit on the semiconductor probe card so that the electrode pads are in rough alignment with the spring mounted probes; vibrating the semiconductor probe card to fine-align the array electrode pads with the array of probes, thereby contacting the array of electrode pads with the array of probes; pressing the integrated circuit and the semiconductor probe card together, thereby deforming some of the spring mounted probes to compensate for dimensional variations in the electrode pads, integrated circuit, and semiconductor probe card; and electrically testing the circuit.

6. The method of claim 5 further comprising varying temperature of the integrated circuit during test while the array of electrode pads remains in contact with the array of probes.

7. The method of claim 5 wherein a plurality of integrated circuits are tested simultaneously using a single semiconductor probe card.

8. The method of claim 7 wherein the step of electrical testing comprises: providing electronic devices on the semiconductor probe card, wherein the electronic devices are interconnected with the array of spring mounted probes; providing power to the integrated circuits from an external tester; providing stimulus data to the integrated circuits from the external tester; detecting electric signals generated by the integrated circuits using the electronic devices on the semiconductor probe card; limiting power provided to one of the integrated circuits when the detected signals indicate that the one integrated circuit is not functional; and transmitting the detected electric signals to the external test circuitry.

9. A probe fixture for testing an unencapsulated integrated circuit comprising: a semiconductor substrate; a plurality of cavities etched int he semiconductor substrate; a plurality of flexible beams formed from said substrate, each beam having a first end attached to the substrate at an upper portion of each cavity, and a second end extending over a portion of each of the cavities; a plurality of conductive probe tips, each probe tip is formed on one of said beams and a conductive interconnect formed on the substrate for coupling each probe tip to an external circuit tester.

10. The probe fixture of claim 9 further comprising a well having sloped sides formed over each of the cavities, wherein the well is sized to receive an electrode of the integrated circuit.

11. The probe fixture of claim 9 further comprising test circuitry formed on the semiconductor substrate and electrically coupled to the probe tip.

12. The probe fixture of claim 9 wherein the conductive interconnect comprises a transmission line.

13. The probe fixture of claim 9 wherein the probe tip comprises a noble metal alloy.

14. The probe fixture of claim 9 wherein the semiconductor substrate comprises a semiconductor material similar to that of the integrated circuit to be tester.

* * * * *

UNITED STATES PATENT AND TRADEMARK OFFICE
CERTIFICATE OF CORRECTION

PATENT NO. : 5,172,050
DATED : December 15, 1992
INVENTOR(S) : Mavin Swapp

It is certified that error appears in the above-indentified patent and that said Letters Patent is hereby corrected as shown below:

Column 8, claim 9, line 1, delete "int he" and insert therefor --in the--.

Column 8, claim 14, line 24, delete "tester" and insert therefor --tested--.

Signed and Sealed this

Twenty-eight Day of February, 1995

Attest:

BRUCE LEHMAN

*Attesting Officer*   *Commissioner of Patents and Trademarks*